(12) United States Patent
Kuo

(10) Patent No.: US 11,264,428 B2
(45) Date of Patent: Mar. 1, 2022

(54) SELF-ALIGNED EMBEDDED PHASE CHANGE MEMORY CELL HAVING A FIN SHAPED BOTTOM ELECTRODE

(71) Applicant: Intel Corporation, Santa Clara, CA (US)

(72) Inventor: Charles C. Kuo, Union City, CA (US)

(73) Assignee: Intel Corporation, Santa Clara, CA (US)

( * ) Notice: Subject to any disclaimer, the term of this patent is extended or adjusted under 35 U.S.C. 154(b) by 80 days.

(21) Appl. No.: 16/630,346

(22) PCT Filed: Sep. 29, 2017

(86) PCT No.: PCT/US2017/054295
§ 371 (c)(1),
(2) Date: Jan. 10, 2020

(87) PCT Pub. No.: WO2019/066898
PCT Pub. Date: Apr. 4, 2019

(65) Prior Publication Data
US 2020/0161370 A1 May 21, 2020

(51) Int. Cl.
H01L 47/00 (2006.01)
H01L 27/24 (2006.01)
H01L 45/00 (2006.01)

(52) U.S. Cl.
CPC ........ *H01L 27/249* (2013.01); *H01L 27/2436* (2013.01); *H01L 45/06* (2013.01); *H01L 45/1233* (2013.01); *H01L 45/1253* (2013.01); *H01L 45/144* (2013.01); *H01L 45/1608* (2013.01); *H01L 45/1675* (2013.01)

(58) Field of Classification Search
CPC ............... H01L 27/249; H01L 27/2436; H01L 45/1253; H01L 45/144; H01L 45/06; H01L 45/1233

See application file for complete search history.

(56) References Cited

U.S. PATENT DOCUMENTS

| 8,043,888 | B2 * | 10/2011 | Mathew | .............. | H01L 45/1226 438/102 |
| 8,179,711 | B2 * | 5/2012 | Kim | .................... | G11C 11/5678 365/148 |
| 8,563,355 | B2 * | 10/2013 | Mathew | .............. | H01L 45/1226 438/102 |
| 9,190,611 | B2 * | 11/2015 | Tio Castro | .............. | H01L 45/06 |

(Continued)

OTHER PUBLICATIONS

International Search Report and Written Opinion for International Patent Application No. PCT/US2017/054295 dated Apr. 2, 2018, 14 pgs.

(Continued)

*Primary Examiner* — Caleb E Henry
(74) *Attorney, Agent, or Firm* — Schwabe, Williamson & Wyatt, P.C.

(57) ABSTRACT

An integrated circuit comprising a self-aligned embedded phase change memory cell is described. In an example, the integrated circuit includes a bottom electrode. A conductive line is above the bottom electrode along a first direction above a substrate. A memory element is coupled between the bottom electrode and the conductive line, the memory element comprising a phase change material layer that is self-aligned with the conductive line.

17 Claims, 7 Drawing Sheets

(56) References Cited

U.S. PATENT DOCUMENTS

| | | | |
|---|---|---|---|
| 10,008,665 B1* | 6/2018 | Gealy | H01L 27/2463 |
| 10,707,417 B1* | 7/2020 | Bruce | H01L 45/1691 |
| 2006/0124916 A1* | 6/2006 | Lung | H01L 27/2418 |
| | | | 257/4 |
| 2006/0128129 A1 | 6/2006 | Stasiak et al. | |
| 2008/0247225 A1* | 10/2008 | Liu | H01L 45/16 |
| | | | 365/163 |
| 2009/0008622 A1* | 1/2009 | Kim | H01L 45/1675 |
| | | | 257/3 |
| 2009/0242866 A1* | 10/2009 | Ko | H01L 45/144 |
| | | | 257/2 |
| 2010/0019217 A1* | 1/2010 | Kim | H01L 45/144 |
| | | | 257/2 |
| 2010/0012796 A1 | 5/2010 | Chou et al. | |
| 2010/0163832 A1* | 7/2010 | Kau | H01L 45/126 |
| | | | 257/4 |
| 2012/0051124 A1* | 3/2012 | Tang | H01L 45/144 |
| | | | 365/163 |
| 2012/0087181 A1* | 4/2012 | Lung | H01L 27/10 |
| | | | 365/163 |
| 2012/0231603 A1* | 9/2012 | Im | H01L 45/06 |
| | | | 438/382 |
| 2014/0004680 A1* | 1/2014 | Eun | H01L 27/2463 |
| | | | 438/382 |
| 2014/0015143 A1 | 1/2014 | Liu et al. | |
| 2014/0151622 A1* | 6/2014 | Oyanagi | H01L 45/144 |
| | | | 257/2 |
| 2015/0340408 A1* | 11/2015 | Russo | H05K 999/99 |
| | | | 257/5 |

OTHER PUBLICATIONS

International Preliminary Report on Patentability for International Patent Application No. PCT/US2017/054295 dated Apr. 9, 2020, 11 pgs.

* cited by examiner

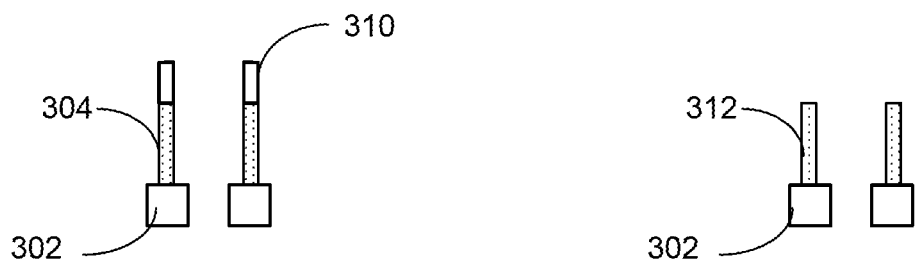
FIG. 3E  FIG. 3F
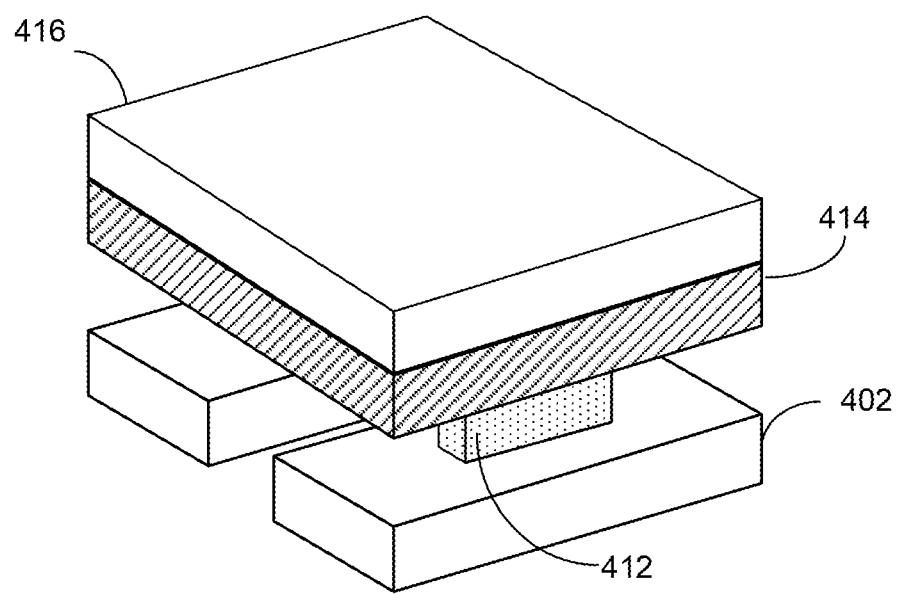
FIG. 4A

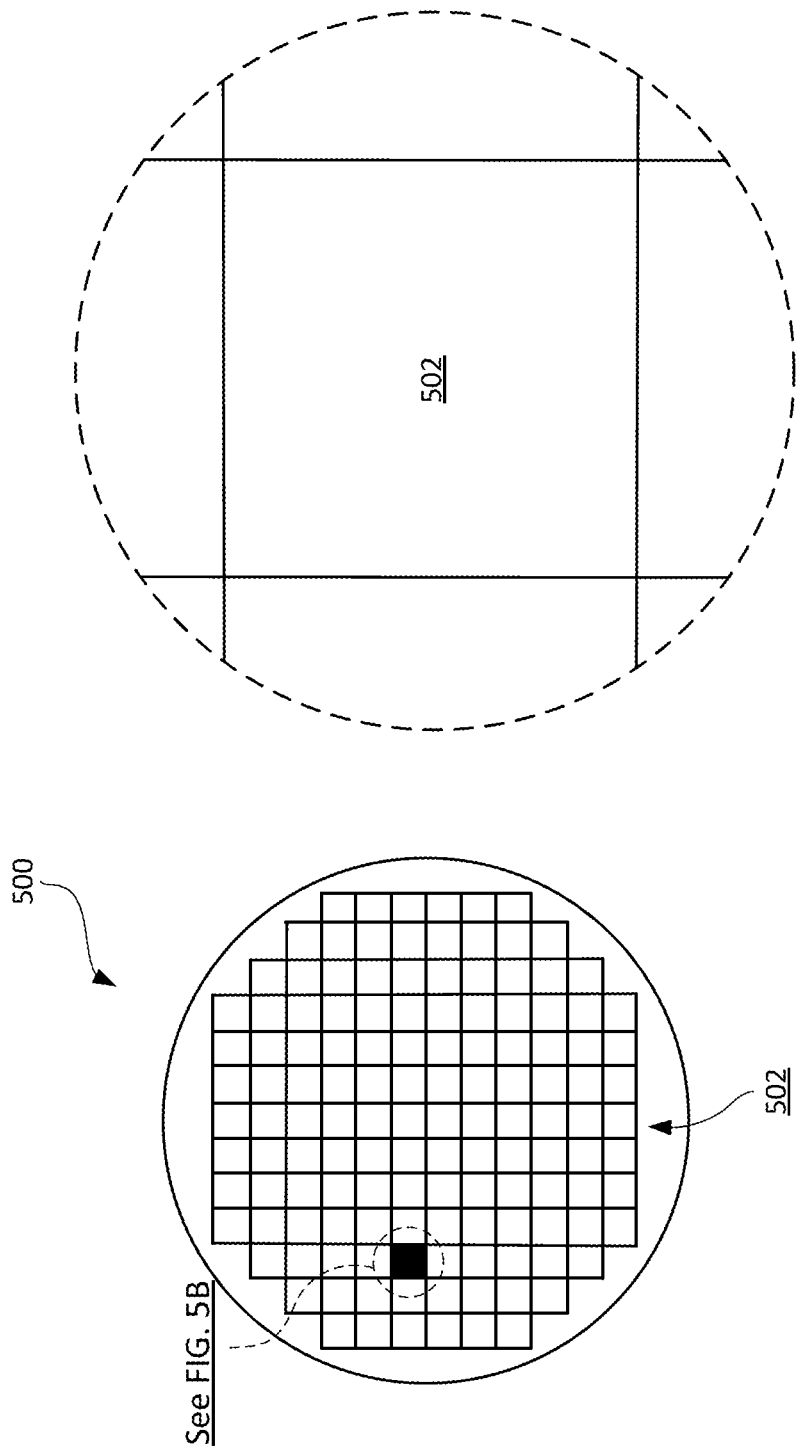

SELF-ALIGNED EMBEDDED PHASE CHANGE MEMORY CELL HAVING A FIN SHAPED BOTTOM ELECTRODE

CROSS-REFERENCE TO RELATED APPLICATION

This patent application is a U.S. National Phase Application under 35 U.S.C. § 371 of International Application No. PCT/US2017/054295, filed Sep. 29, 2017, entitled "SELF-ALIGNED EMBEDDED PHASE CHANGE MEMORY CELL," which designates the United States of America, the entire disclosure of which is hereby incorporated by reference in its entirety and for all purposes.

TECHNICAL FIELD

Embodiments of the disclosure are in the field of integrated circuit structures and, in particular, a self-aligned embedded phase change memory cell.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Embedded SRAM and DRAM have problems with non-volatility and soft error rates, while embedded FLASH memories require additional masking layers or processing steps during manufacture, require high-voltage for programming, and have issues with endurance and reliability. Non-volatile memory based on resistance change, known as RRAM/ReRAM, typically operates at voltages greater than 1V, typically requires a high voltage (>1V) forming step to form a filament, and typically have high resistance values limiting read performance. For low voltage non-volatile embedded applications, operating voltages less than 1V and compatible with CMOS logic processes may be desirable or advantageous.

Variability in conventional and state-of-the-art fabrication processes may limit the possibility to further extend such processes into the, e.g. 10 nm or sub-10 nm range. Consequently, fabrication of the functional components needed for future technology nodes may require the introduction of new methodologies or the integration of new technologies in current fabrication processes or in place of current fabrication processes.

Thus, significant improvements are still needed in the area of nonvolatile device manufacture and operation.

BRIEF DESCRIPTION OF THE DRAWINGS

As a first example.

FIGS. 3A-3F are cross-sectional diagrams illustrating a process for fabricating a self-aligned embedded PCM memory cell according to example embodiments.

FIGS. 4A-4B illustrates an angled three-dimensional view showing the fabrication process after formation of the bottom electrode fins.

FIGS. 5A and 5B are top views of a wafer and dies that include one or more embedded non-volatile memory structures having a bilayer selector, in accordance with one or more of the embodiments disclosed herein.

DESCRIPTION OF THE EMBODIMENTS

Figure 1:
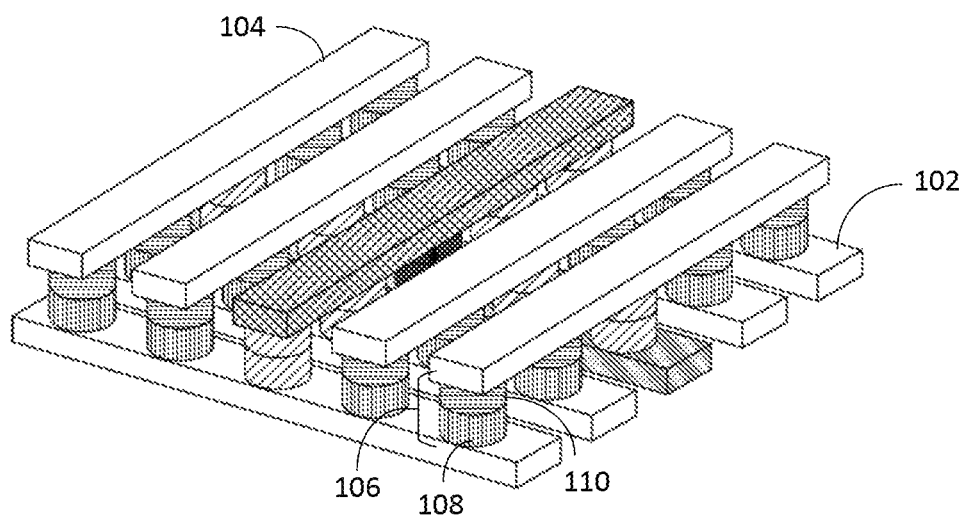
FIG. 1 illustrates an angled three-dimensional view of a PCM implemented as a cross-point memory array, in accordance with an embodiment of the present disclosure.

A self-aligned embedded phase change memory cell is described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than ten metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with an embodiment of the present disclosure, one or more embodiments are directed to building a self-aligned embedded phase change memory (PCM). A metal bitline can be used to create a self-aligned phase change memory cell, in which top and bottom electrodes are formed without much concern of lithographic misalignment. Such embodiments may have applications for one or more of cross-point memory, embedded memory, memory, and memory arrays.

To provide context, non-volatile memory devices such as a magnetic tunnel junction (MTJ) memory device or a resistive random access memory (RRAM) device depend on a phenomenon of resistance switching to store information. The non-volatile memory device functions as a variable resistor where the resistance of the device may switch between a high resistance state and a low resistance state. A non-volatile memory device may be coupled with a selector element to form a memory cell. The selector may be a volatile switching element that is placed in series with the non-volatile memory device. A large collection of such memory cells forms a key component of non-volatile embedded memory.

Phase-change memory (also known as PCM, PCME, PRAM, PCRAM, OUM (ovonic unified memory) and C-RAM or CRAM (chalcogenide RAM)) is a type of non-volatile random-access memory. PCM utilizes the large resistivity contrast between crystalline (low resistivity) and amorphous (high resistivity) phases of the phase change material to hold one or more bits in a single cell.

As a first example, FIG. 1 illustrates an angled three-dimensional view of a PCM implemented as a cross-point memory array, in accordance with an embodiment of the present disclosure.

Referring to FIG. 1, an integrated circuit structure 100 includes a first plurality of conductive lines 104 along a first direction above a substrate. In an embodiment, the first plurality of conductive lines 104 is a plurality of bitlines. A plurality of PCM memory cells 106 is on individual ones of the first plurality of conductive lines 104. Individual ones of the plurality of PCM memory cells 106 include a bottom electrode (or selector element) 108 coupled to a top memory element 110. A second plurality of conductive lines 102 is on the plurality of bottom electrodes 108. In an embodiment, the second plurality of conductive lines 102 is a plurality of word lines. The second plurality of conductive lines 102 is along a second direction orthogonal to the first direction. In an embodiment, individual ones of the plurality of memory elements 106 have a length along the first direction approximately the same as a length along the second direction, as is depicted.

Typically, the PCM memory cell 106 is fabricated by discretely patterning the plurality of memory elements 110 and the bottom electrodes 108 before the first plurality of conductive lines 104 (e.g., bitlines). That is, electrode material is deposited and etched followed by depositing and etching the memory material to form a PCM memory cell 106. Finally, the bitline is patterned over the PCM memory cells 106. Although this process works for its intended purpose, the process may also lead to misalignment between the bottom electrodes 110 and the memory elements 106.

Figure 2:
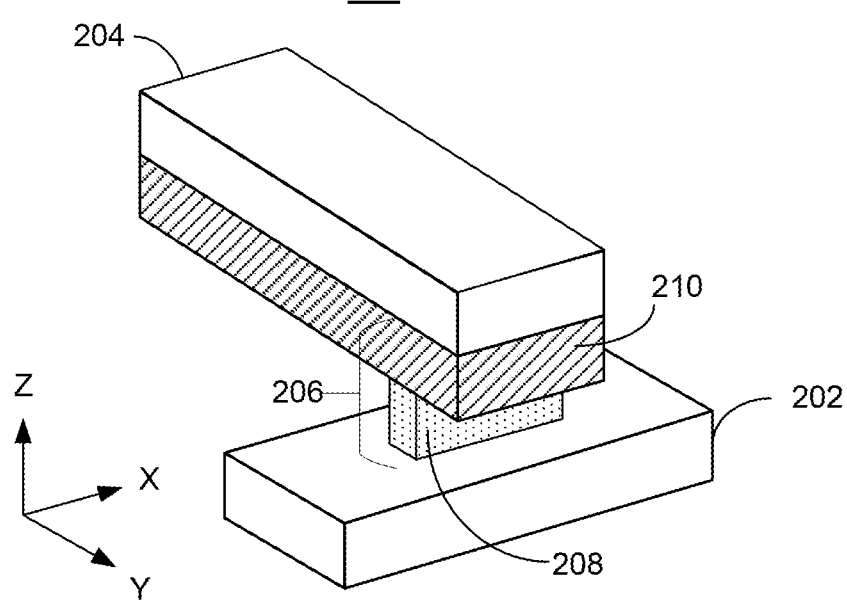
FIG. 2 is a diagram of a self-aligned embedded PCM memory cell fabricated in accordance with the disclosed embodiments.

In accordance with the embodiments disclosed herein, a method is provided for fabricating a self-aligned embedded phase change memory (PCM). FIG. 2 is a diagram of a self-aligned embedded PCM memory cell 200 fabricated in accordance with the disclosed embodiments.

According to the disclosed embodiment, an integrated circuit 200 comprises a bottom electrode 208, a conductive line 204 above the bottom electrode 208, and a PCM memory element 210 coupled between the bottom electrode 208 and the conductive line 204. In one preferred embodiment, PCM memory element 210 comprises a phase change material layer that is self-aligned with the conductive line 204 (e.g., bitline) and has substantially the same shape and dimensions as the conductive line 204. Accordingly, the PCM memory element 210 and the bottom electrode 208 comprise a self-aligned embedded PCM memory cell 206. Further, the PCM layer may have substantially a same length along the first direction as the conductive line 204, and therefore may be shared with one or more adjacent PCM memory cells 206.

According to a further embodiment, rather than a cylindrical shape, the bottom electrode 208 may have a thin rectangular shape referred to as a fin or a slab. In the example shown, the first direction of the conductive line 204 is in a Y-direction, and the bottom electrode 208 fin is oriented orthogonally to the first direction such that the width of the bottom electrode 208 fin is substantially the same as the PCM memory element 210. Since the PCM memory element 210 the self-aligned with the conductive line 204, the width of the bottom electrode 208 is also substantially the same as the conductive line 204.

According to the present embodiments, the self-aligned embedded PCM memory cell 206 is patterned or self-aligned with the metal layer comprising the conductive line 204 because the bitline pattern transfers into the PCM memory element 210, creating strips PCM memory cells 200, as shown, rather than discrete cylinders (see FIG. 1). Such an arrangement significantly reduces any misalignment in the X- and Y-directions.

In one embodiment, the bottom electrode 208 may be connected to a transistor (not shown). In an embodiment where the PCM memory cell 200 comprises a cross-point array, the bottom electrode 208 may be coupled to a second conductive line 202, such as a word line.

In one embodiment, the PCM memory elements 210 can be composed of a material selected from the group consisting of germanium (Ge), antimony (Sb), and tellurium (Te). In an embodiment, the bottom electrodes 208 can be composed of a material selected from the group consisting of tungsten nitride (WN), tantalum nitride (TaN), titanium nitride (TiN), and titanium aluminum nitride (TiAlN). In an embodiment, the plurality of conductive lines can be composed of a material selected from the group consisting of tungsten (W), tantalum (Ta), titanium (Ti), and titanium aluminum nitride (TiAl).

Figure 3A:
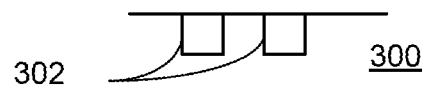
Figure 3B:
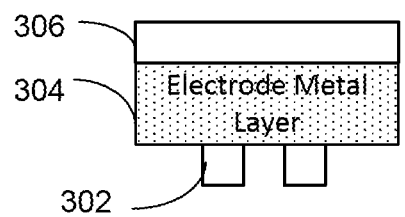
Figure 3C:
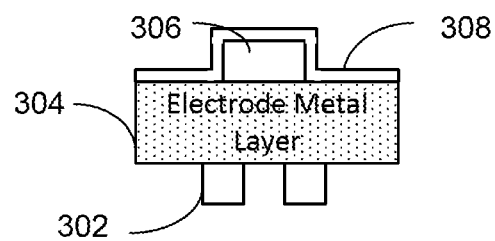
Figure 3D:
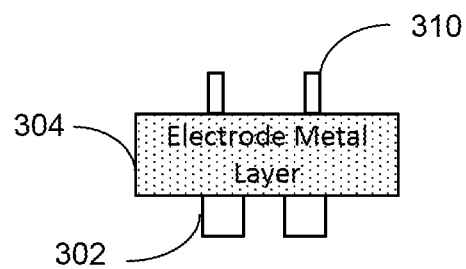

FIGS. 3A-3F are cross-sectional diagrams illustrating a process for fabricating a self-aligned embedded PCM memory cell according to example embodiments. The process may begin by forming word lines 302 on a substrate 300, as shown in FIG. 3A. FIG. 3B shows the process after an electrode metal layer 304 is formed over the word lines 302, and a sacrificial layer is formed over the electrode metal layer 304. FIG. 3C shows the process after the sacrificial layer 306 has been patterned to form spacers, which will be used to form the bottom electrode fins, and a hard mask 308 has been formed over the patterned sacrificial layer 306. FIG. 3D shows the process after the hard mask 308 has been removed except for portions covering sidewalls of the patterned sacrificial layer 306, forming hard mask fins 310. FIG. 3E shows the process after the electrode metal layer 304 has been removed except for portions under the hard mask fins 310, which form bottom electrode fins 312 over the word lines 302, as shown in FIG. 3F after the hard mask fins 310 have been removed.

Figure 4B:
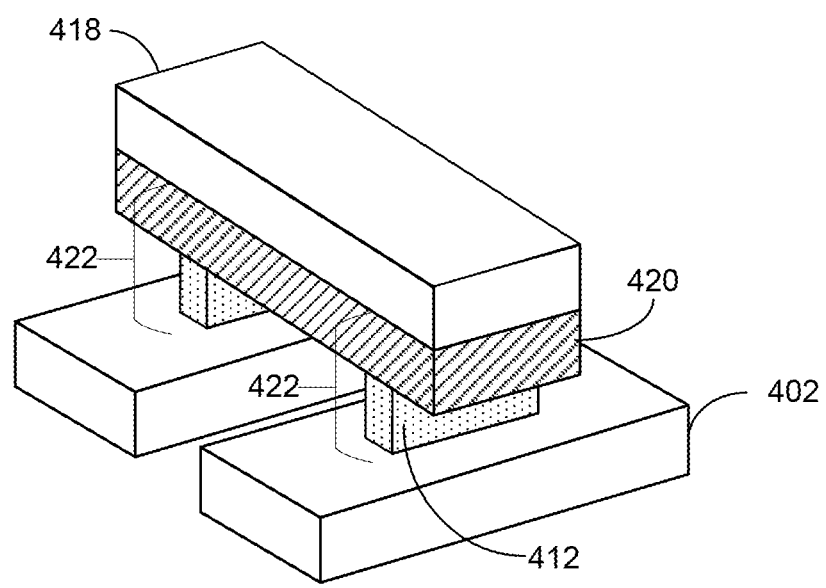

FIGS. 4A-4B illustrates an angled three-dimensional view showing the fabrication process after formation of the bottom electrode fins. FIG. 4A illustrates the fabrication process after a phase change memory material layer 414 is blanket deposited over the bottom electrode fins 412 followed by a blanket deposit of a metal layer 416 over the phase change memory material layer 414.

FIG. 4B illustrates an angled three-dimensional view after the metal layer 416 and the phase change memory material layer 414 of FIG. 4A are etched to form a bitline 418 and respective phase change memory elements 420 over each bottom electrode fin 412 to form a plurality of self-aligned embedded PCM memory cells 422. According to the disclosed embodiments, the phase change memory element 420 is continuously formed along the same direction as the bitline 418 and is self-aligned to that bitline 418.

In an embodiment, the bottom electrodes may be selector devices or selector transistors. For example, in an embodiment, the selector transistors may be metal-oxide semiconductor (MOS) transistors, or are bipolar transistors. In one embodiment, the selector transistors have a three-dimensional architecture, such as a trigate device, an independently accessed double gate device, or a FIN-FET.

In an embodiment, interconnect lines, such as bit lines and word lines described above, are composed of one or more metal or metal-containing conductive structures. The conductive interconnect lines are also sometimes referred to in the art as traces, wires, lines, metal, interconnect lines or simply interconnects. In a particular embodiment, each of the interconnect lines includes a barrier layer and a conductive fill material. In an embodiment, the barrier layer is composed of a metal nitride material, such as tantalum nitride or titanium nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

Interconnect lines, such as bit lines and word lines described above, may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines spaced at a constant pitch and having a constant width. The pattern may be fabricated by a pitch halving or pitch quartering, or other pitch division, approach.

In an embodiment, as is also used throughout the present description, lithographic operations may be performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

It is to be appreciated that the layers and materials described in association with embodiments herein are typically formed on or above an underlying semiconductor substrate. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated as or on underlying lower level back end of line (BEOL) interconnect layers.

In an embodiment, selector devices, such as bottom electrodes, are fabricated as FEOL devices in or on a substrate. The substrate may be composed of a semiconductor material that can withstand a manufacturing process and in which charge can migrate. In an embodiment, the substrate is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in the bulk substrate is greater than 97%. In another embodiment, the bulk substrate is composed of an epitaxial layer grown atop a distinct crystalline substrate, e.g. a silicon epitaxial layer grown atop a boron-doped bulk silicon mono-crystalline substrate. The bulk substrate may alternatively be composed of a group III-V material. In an embodiment, the bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, the bulk substrate is composed of a III-V material and the charge-carrier dopant impurity atoms are ones such as, but not limited to, carbon, silicon, germanium, oxygen, sulfur, selenium or tellurium.

The integrated circuit structures described herein may be included in an electronic device. As an example of one such apparatus, FIGS. 5A and 5B are top views of a wafer and dies that include one or more embedded non-volatile memory structures having a bilayer selector, in accordance with one or more of the embodiments disclosed herein.

Referring to FIGS. 5A and 5B, a wafer 500 may be composed of semiconductor material and may include one or more dies 502 having integrated circuit (IC) structures formed on a surface of the wafer 500. Each of the dies 502 may be a repeating unit of a semiconductor product that includes any suitable IC (e.g., ICs including one or more embedded non-volatile memory structures having self-aligned embedded PCM memory cells, such as described above. After the fabrication of the semiconductor product is complete, the wafer 500 may undergo a singulation process in which each of the dies 502 is separated from one another to provide discrete "chips" of the semiconductor product. In particular, structures that include embedded non-volatile memory structures having an independently scaled selector as disclosed herein may take the form of the wafer 500 (e.g., not singulated) or the form of the die 502 (e.g., singulated). The die 502 may include one or more embedded non-volatile memory structures based on self-aligned PCM memory cells and/or supporting circuitry to route electrical signals, as well as any other IC components. In some embodiments, the wafer 500 or the die 502 may include an additional memory device (e.g., a static random access memory (SRAM) device), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 6:
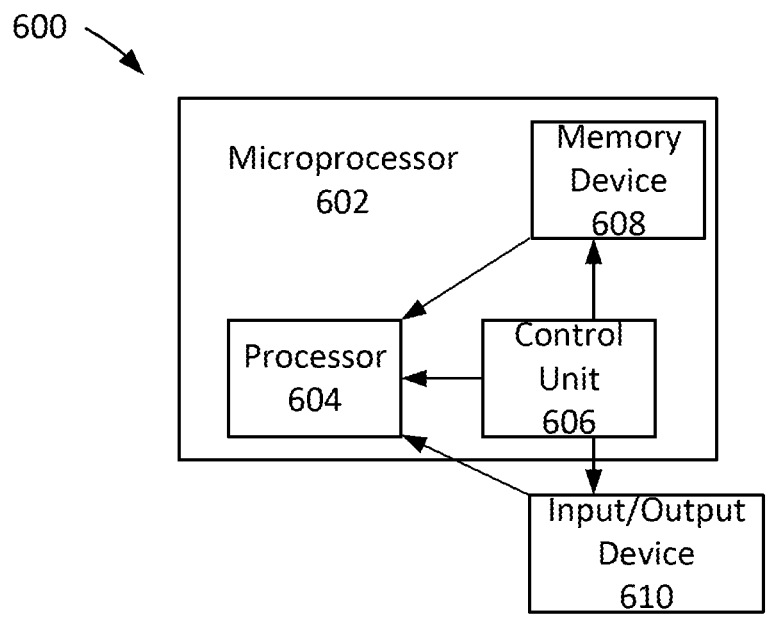
FIG. 6 illustrates a block diagram of an electronic system, in accordance with an embodiment of the present disclosure.

FIG. 6 illustrates a block diagram of an electronic system 600, in accordance with an embodiment of the present disclosure. The electronic system 600 can correspond to, for example, a portable system, a computer system, a process control system, or any other system that utilizes a processor and an associated memory. The electronic system 600 may include a microprocessor 602 (having a processor 604 and control unit 606), a memory device 608, and an input/output device 610 (it is to be appreciated that the electronic system 600 may have a plurality of processors, control units, memory device units and/or input/output devices in various embodiments). In one embodiment, the electronic system 600 has a set of instructions that define operations which are to be performed on data by the processor 604, as well as, other transactions between the processor 604, the memory device 608, and the input/output device 610. The control unit 606 coordinates the operations of the processor 604, the memory device 608 and the input/output device 610 by cycling through a set of operations that cause instructions to be retrieved from the memory device 608 and executed. The memory device 608 can include a non-volatile memory cell as described in the present description. In an embodiment, the memory device 608 is embedded in the microprocessor 602, as depicted in FIG. 6. In an embodiment, the processor 604, or another component of electronic system 600, includes one or more embedded non-volatile memory structures having self-aligned PCM memory cells such as those described herein.

Figure 7:
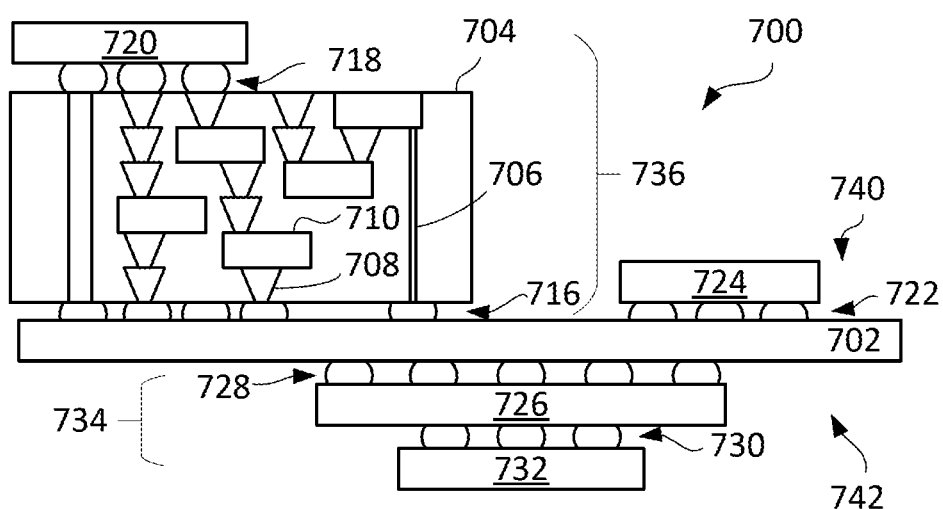
FIG. 7 is a cross-sectional side view of an integrated circuit (IC) device assembly that may include one or more embedded non-volatile memory structures having a self-aligned PCM memory, in accordance with one or more of the embodiments disclosed herein.

FIG. 7 is a cross-sectional side view of an integrated circuit (IC) device assembly that may include one or more embedded non-volatile memory structures having a self-aligned PCM memory, in accordance with one or more of the embodiments disclosed herein.

Referring to FIG. 7, an IC device assembly 700 includes components having one or more integrated circuit structures described herein. The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include a number of embedded non-volatile memory structures having a self-aligned PCM memory, such as disclosed herein.

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 702 of FIG. 7B), or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 710 and vias 708, including but not limited to through-silicon vias (TSVs) 706. The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

Figure 8:
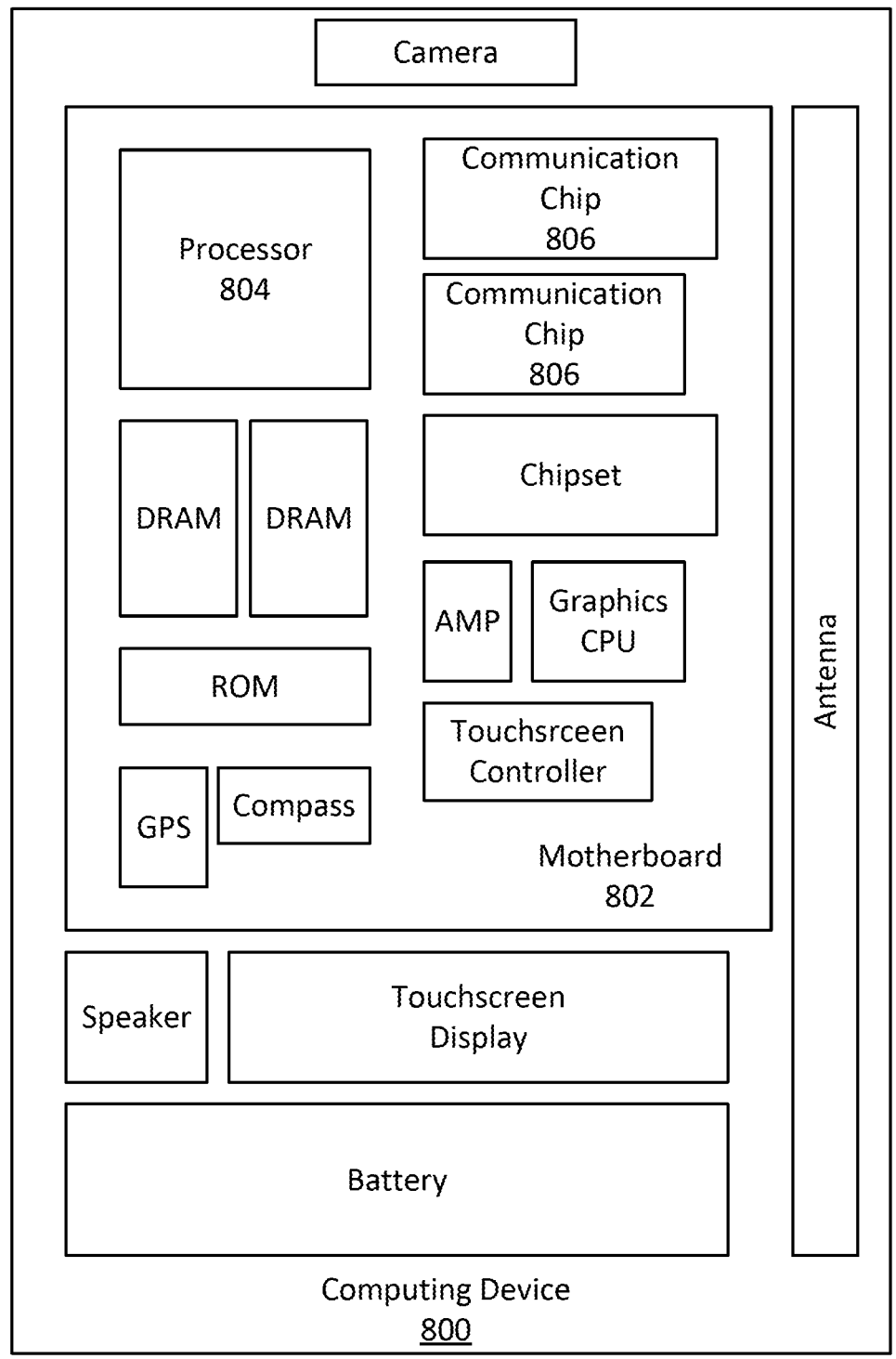
FIG. 8 illustrates a computing device in accordance with one implementation of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more embedded non-volatile memory structures having a self-aligned PCM memory, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more embedded non-volatile memory structures having a self-aligned PCM memory, in accordance with implementations of embodiments of the disclosure.

In further implementations, another component housed within the computing device 800 may contain an integrated circuit die that includes one or more embedded non-volatile memory structures having a self-aligned PCM memory, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include embedded non-volatile memory structures having self-aligned PCM memory elements.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a bottom electrode. A conductive line is above the bottom electrode along a first direction above a substrate. A memory element is coupled between the bottom electrode and the conductive line, the memory element comprising a phase change material layer that is self-aligned with the conductive line.

Example Embodiment 2

The integrated circuit structure of example embodiments 1, wherein phase change material layer has substantially a same shape and dimensions as the conductive line Example Embodiment 3

The integrated circuit structure of example embodiment 1-2, wherein the memory element and the bottom electrode comprise a self-aligned embedded PCM memory cell.

Example Embodiment 4

The integrated circuit structure of example embodiment 1-3, wherein self-aligned embedded PCM memory cell is implemented as a cross-point memory array.

Example Embodiment 5

The integrated circuit structure of example embodiment 1-4, wherein the phase change material layer has substantially a same length along the first direction as the conductive line.

Example Embodiment 6

The integrated circuit structure of example embodiment 1-5, wherein the phase change material layer is shared with one or more adjacent PCM memory cells.

Example Embodiment 7

The integrated circuit structure of example embodiment 1-6, wherein the bottom electrode comprises a fin.

Example Embodiment 8

The integrated circuit structure of example embodiment 1-7, wherein a width of the bottom electrode fin is oriented along a second direction orthogonal to the first direction, such that the width of the bottom electrode fin is substantially the same as the memory element.

Example Embodiment 9

The integrated circuit structure of example embodiment 1-3, 5-8, wherein the bottom electrode is coupled to a transistor.

Example Embodiment 10

The integrated circuit structure of example embodiment 1-8, wherein the bottom electrode is coupled to a second conductive line below the bottom electrode along a second direction orthogonal to the first direction.

Example Embodiment 11

The integrated circuit structure of example embodiment 1-10, wherein the memory element is composed of material selected from the group consisting of germanium, antimony, and tellurium.

Example Embodiment 12

The integrated circuit structure of example embodiment 1-11, wherein the bottom electrode is composed of a material selected from the group consisting of tungsten nitride, tantalum, titanium nitride, and titanium aluminum nitride.

Example Embodiment 13

An integrated circuit structure includes a plurality of first conductive lines along a first direction above a substrate. A plurality of phase change memory cells is on individual ones of the first plurality of conductive lines, each one of the plurality of phase change memory cells having a bottom electrode coupled to a memory element, the memory element comprising a phase change material layer that is self-aligned with the conductive line. A plurality of second conductive lines is along a second direction orthogonal to the first direction above the substrate and coupled to the bottom electrodes.

Example Embodiment 14

The integrated circuit structure of example embodiments 13, wherein phase change material layer has substantially a same shape and dimensions as the conductive line.

Example Embodiment 15

The integrated circuit structure of example embodiment 13-14, wherein the memory element and the bottom electrode comprise a self-aligned embedded PCM memory cell.

Example Embodiment 16

The integrated circuit structure of example embodiment 13-15, wherein self-aligned embedded PCM memory cell is implemented as a cross-point memory array.

Example Embodiment 17

The integrated circuit structure of example embodiment 13-16, wherein the phase change material layer has substantially a same length along the first direction as the conductive line.

Example Embodiment 18

The integrated circuit structure of example embodiment 13-17, wherein the phase change material layer is shared with one or more adjacent PCM memory cells.

Example Embodiment 19

The integrated circuit structure of example embodiment 13-18, wherein the bottom electrode comprises a fin.

Example Embodiment 20

The integrated circuit structure of example embodiment 13-19, wherein a width of the bottom electrode fin is oriented along a second direction orthogonal to the first direction, such that the width of the bottom electrode fin is substantially the same as the memory element.

Example Embodiment 21

The integrated circuit structure of example embodiment 13-20, wherein the memory element is composed of material selected from the group consisting of germanium, antimony, and tellurium.

Example Embodiment 22

A method of fabricating a self-aligned embedded PCM memory cell includes forming a word lines on a substrate. An electrode metal layer is formed over the word lines. A sacrificial layer is formed over the electrode metal layer and the sacrificial layer is patterned to form spacers. A hardmask is formed over the pattern to sacrificial layer, and the hardmask is removed except for portions covering sidewalls of the patterned sacrificial layer to form hardmask fins. The electrode metal layer is removed except for portions under the hardmask fins to form bottom electrode fins over the word lines. A phase change memory material layer is blanket deposited followed by a metal layer over the bottom electrode fins. The metal layer and the phase change memory material layer are etch to form a bitline and respective phase change memory elements over each bottom electrode fin.

Example Embodiment 23

The method of fabricating a self-aligned embedded PCM memory cell of example embodiment 22, further comprising removing the hardmask fins before blanket depositing the phase change memory material layer.

Example Embodiment 24

The method of fabricating a self-aligned embedded PCM memory cell of example embodiment 22-23, further comprising forming the respective phase change memory elements from a material selected from the group consisting of germanium, antimony, and tellurium.

Example Embodiment 25

The method of fabricating a self-aligned embedded PCM memory cell of example embodiment 22-24, further comprising forming the respective phase change memory elements and corresponding electrode fins as self-aligned embedded PCM memory cells.

What is claimed is:

1. An integrated circuit structure, comprising:
    a bottom electrode;
    a conductive line above the bottom electrode along a first direction above a substrate; and
    a memory element of a plurality of memory elements coupled between the bottom electrode and the conductive line, the memory element comprising a phase change material layer that is self-aligned with the conductive line, wherein the phase change material layer has substantially a same shape and dimensions as the conductive line and is shared with one or more adjacent memory elements;
    wherein the bottom electrode comprises a rectangular shaped fin having a length and a width that is longer than the length, wherein the fin is oriented orthogonally to the first direction such that the width of the bottom electrode is substantially the same as the memory element.

2. The integrated circuit structure of claim 1, wherein the memory element and the bottom electrode comprise a self-aligned embedded PCM memory cell.

3. The integrated circuit structure of claim 1, wherein the self-aligned embedded PCM memory cell is implemented as a cross-point memory array.

4. The integrated circuit structure of claim 1, wherein the phase change material layer has substantially a same length along the first direction as the conductive line.

5. The integrated circuit structure of claim 1, wherein the bottom electrode is coupled to a transistor.

6. The integrated circuit structure of claim 1, wherein the bottom electrode is coupled to a second conductive line below the bottom electrode along a second direction orthogonal to the first direction.

7. The integrated circuit structure of claim 1, wherein the memory element is composed of material selected from the group consisting of germanium, antimony, and tellurium.

8. The integrated circuit structure of claim 1, wherein the bottom electrode is composed of a material selected from the group consisting of tungsten nitride, tantalum, titanium nitride, and titanium aluminum nitride.

9. An integrated circuit structure, comprising:
    a plurality of first conductive lines along a first direction above a substrate;
    a plurality of phase change memory cells on individual ones of the first plurality of conductive lines, each one of the plurality of phase change memory cells having a bottom electrode coupled to a memory element, the memory element comprising a phase change material layer that is self-aligned with the conductive line, wherein the phase change material layer has substantially a same shape and dimensions as the conductive line and is shared with one or more adjacent phase change memory elements;
    wherein the bottom electrode comprises a rectangular shaped fin having a length and a width that is longer than the length, wherein the fin is oriented orthogonally to the first direction such that the width of the bottom electrode is substantially the same as the phase change material layer; and
    a plurality of second conductive lines along a second direction orthogonal to the first direction above the substrate and coupled to the bottom electrodes.

10. The integrated circuit structure of claim 9, wherein the memory element and the bottom electrode comprise a self-aligned embedded PCM memory cell.

11. The integrated circuit structure of claim 9, wherein the integrated circuit structure comprises a cross-point memory array.

12. The integrated circuit structure of claim 9, wherein the phase change material layer has substantially a same length along the first direction as the conductive line.

13. The integrated circuit structure of claim 9, wherein the memory element is composed of material selected from the group consisting of germanium, antimony, and tellurium.

14. A method of fabricating a self-aligned embedded PCM memory cell, the method comprising:
   forming a word lines on a substrate;
   forming and electrode metal layer over the word lines;
   forming a sacrificial layer over the electrode metal layer and patterning the sacrificial layer to form spacers;
   forming a hardmask over the patterned sacrificial layer and removing the hardmask except for portions covering sidewalls of the patterned sacrificial layer to form hardmask fins;
   removing the electrode metal layer except for portions under the hardmask fins to form bottom electrode fins over the word lines;
   blanket depositing a phase change memory material layer followed by a metal layer over the bottom electrode fins; and
   etching the metal layer and the phase change memory material layer to form a bitline and respective phase change memory elements over each bottom electrode fin, wherein the phase change material layer has substantially a same shape and dimensions and wherein the bottom electrode tins are patterned with a rectangular shape having a length and a width that is longer than the length, wherein the bottom electrode fins are oriented orthogonally to the bitline such that the width of the bottom electrode fins is substantially the same as the phase change memory elements.

15. The method of claim 14, further comprising removing the hardmask fins before blanket depositing the phase change memory material layer.

16. The method of claim 14, further comprising forming the respective phase change memory elements from a material selected from the group consisting of germanium, antimony, and tellurium.

17. The method of claim 14, further comprising forming the respective phase change memory elements and corresponding electrode fins as self-aligned embedded PCM memory cells.

* * * * *